(12) United States Patent
Anderson

(10) Patent No.: US 9,112,486 B2
(45) Date of Patent: Aug. 18, 2015

(54) ASYMMETRIC PROPAGATION DELAYS IN LEVEL SHIFTERS AND RELATED CIRCUITS

(71) Applicant: NXP B.V., Eindhoven (NL)

(72) Inventor: Alma Anderson, Chandler, AZ (US)

(73) Assignee: NXP B.V., EIndhoven (NL)

( * ) Notice: Subject to any disclaimer, the term of this patent is extended or adjusted under 35 U.S.C. 154(b) by 6 days.

(21) Appl. No.: 13/677,874

(22) Filed: Nov. 15, 2012

(65) Prior Publication Data

US 2014/0055186 A1 Feb. 27, 2014

Related U.S. Application Data

(60) Provisional application No. 61/692,377, filed on Aug. 23, 2012.

(51) Int. Cl.
*H03L 5/00* (2006.01)
*H03K 3/353* (2006.01)
*H03K 3/012* (2006.01)
*H03K 3/356* (2006.01)
*H03K 19/0185* (2006.01)

(52) U.S. Cl.
CPC ............... *H03K 3/353* (2013.01); *H03K 3/012* (2013.01); *H03K 3/356* (2013.01); *H03K 19/0185* (2013.01)

(58) Field of Classification Search
USPC .......... 327/108, 170, 333, 99; 326/68, 80, 81; 365/189.11
See application file for complete search history.

(56) References Cited

U.S. PATENT DOCUMENTS

| | | | |
|---|---|---|---|
| 6,333,662 B1 | 12/2001 | Umezawa et al. | |
| 6,734,705 B2 * | 5/2004 | Pulkin et al. | 327/333 |
| 7,251,740 B2 * | 7/2007 | Newman | 327/333 |
| 2002/0050849 A1 | 5/2002 | Hayashi et al. | |
| 2007/0146007 A1 * | 6/2007 | Price | 326/68 |

OTHER PUBLICATIONS

Extended European Search Report. European Patent Office, Oct. 29, 2013. pp. 8.

* cited by examiner

*Primary Examiner* — Long Nguyen

(57) ABSTRACT

Aspects of the present disclosure are directed towards apparatus useful for processing communications between different signaling voltage levels. Different signaling voltage levels are accomplished by creating true and complement signals from at least one input signal, each of which are subject to different delays, and level shifting the true and complement signals to a new signaling voltage level. The true or complement signal subject to a smaller timing delay is selected, and used to provide an output signal.

20 Claims, 6 Drawing Sheets

ASYMMETRIC PROPAGATION DELAYS IN LEVEL SHIFTERS AND RELATED CIRCUITS

Digital circuits communicate data using signals having logic levels that represent information. A logic level of a signal represents a particular state of the signal that is often represented by the voltage difference between the signal and a reference, such as a ground or another signal. For instance, binary logic operates with a high voltage representing one value (e.g., a "1" value) and a low voltage representing another value (e.g., a "0" value). The acceptable voltage levels for each state depends on the particular digital circuit and can vary between two communicating digital circuits.

Level shifting can be used to allow for a signal to cross a boundary between different acceptable voltages for signaling. This can occur when a signal crosses a boundary between two different voltage domains. The different voltage domains may be referenced to the same ground, or they may have different reference or ground potentials. Differences between reference or ground potentials in the two domains can even vary over time. The signals may have different amplitude positive voltages to ground or the same amplitude to different grounds even different amplitudes and different grounds.

Various aspects of the present disclosure are directed to apparatus useful for processing communications between different signaling voltage levels by creating into true and complement signals from at least one input signal. Each of the true and complement signals are subject to different timing delays for respective signal transitions, and are level shifted into a new signaling voltage level. Such apparatus include logic circuitry that determines, relative to a particular signal state, which of the true and complement signals is subject to a smaller timing delay. In response to this determination, the logic circuitry generates a selection signal that identifies the determined one of the true and complement signals. In response to the selection signal generated by logic circuitry, signal control circuit provides the identified one of the true and complement signals as an output signal.

Additional aspects of the present disclosure are directed towards apparatus and related methods that can be useful for creating an output signal that is level shifted to an output voltage signaling range. The methods and/or apparatus create the output signal in response to an input signal line carrying signals in an input voltage signaling range. The apparatus accomplish level shifting through use of first and second drive circuits. The first drive circuit drives a first signal line in response to a first signal level of the input signal, and releases the first signal line in response to a second, different signal level of the input signal. The second drive circuit drives a second signal line in response to the second signal level of the input signal, and releases the second signal line in response to the first signal level of the input signal. A pull-up/down circuit is configured and arranged to pull each of the first and second signal lines to a signal level in the output voltage signaling range. The first and second signal lines each transition to the signal level in the output voltage signaling range at a first rate that is slower than a second rate at which the first and second signal lines each transition in response to being driven by the first and second drive circuits, respectively. An output circuit is configured to generate the output signal in response to determining, based upon a current state of the output signal, which of the first and second signal lines has a faster transition.

The above discussion is not intended to describe each embodiment or every implementation. The figures and following description also exemplify various embodiments.

Various example embodiments may be more completely understood in consideration of the following detailed description in connection with the accompanying drawings, in which.

Figure 1:
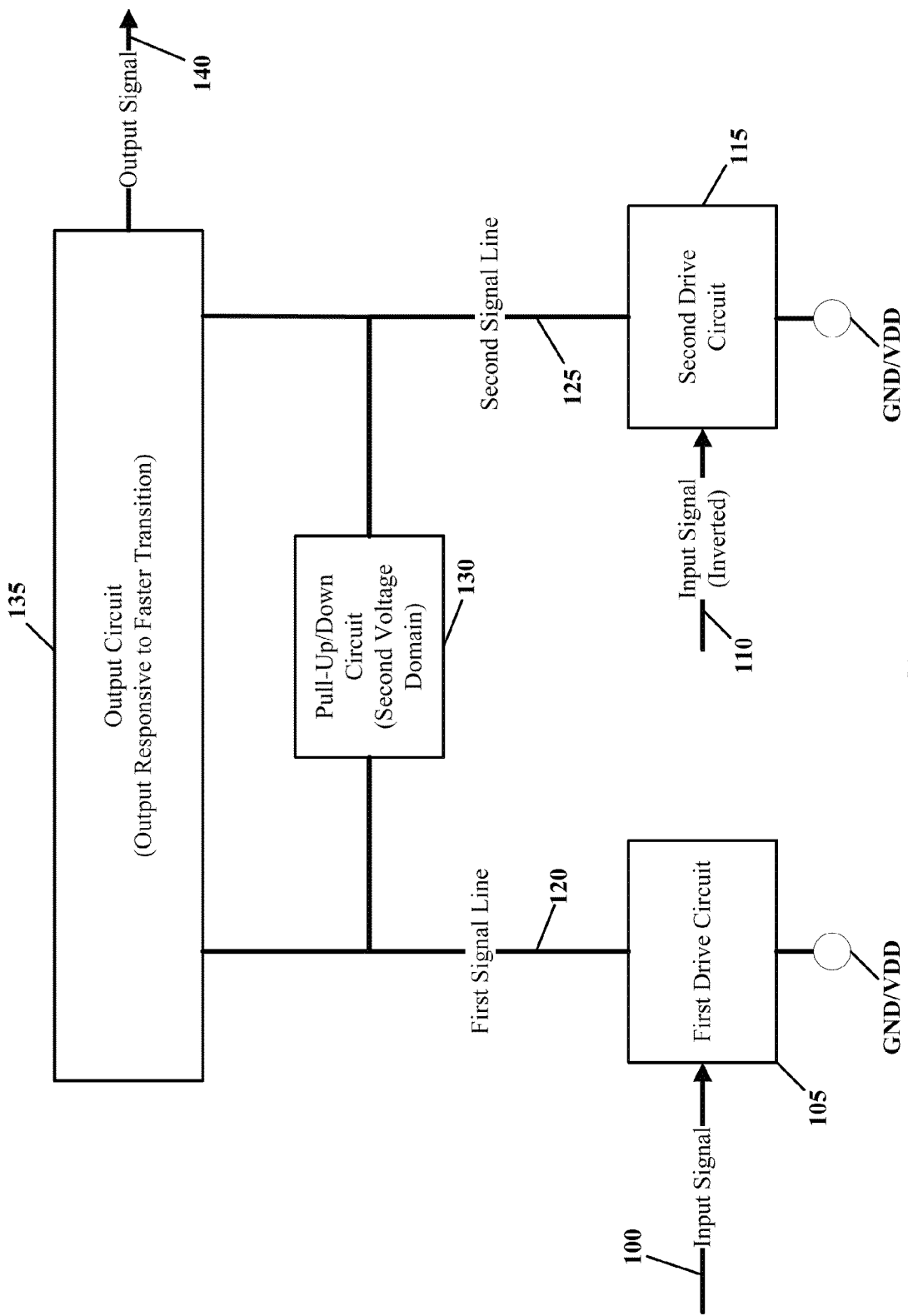
FIG. 1 shows a block diagram of an example apparatus useful for creating a level shifted output voltage signaling range, consistent with various aspects of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

Aspects of the present disclosure are believed to be applicable to a variety of different types of apparatus, systems and methods involving level-shifting of signals. While not necessarily so limited, various aspects may be appreciated through a discussion of examples using this context.

Embodiments of the present disclosure recognize that certain level-shifting circuits have different signal transition rates for positive and negative transitions, respectively. This can be caused by the use of different drive circuits for each transition. For instance, a pull-up/down circuit can be used to bring the signal voltage of an internal signal line to a first signal level when the signal line is not being actively driven. A drive circuit can be configured and arranged to drive the signal line to a second signal level and thereby overcome the pull-up/down circuit. This drive circuit can be responsive to an input signal that carries the information to be transmitted using the level-shifting circuit. The slew rate for each transition can be significantly different. Accordingly, the delay from when the input signal changes value to when the internal signal line changes value can differ depending upon whether the signal transition is a negative or positive transition.

Certain embodiments of the present disclosure are directed toward level-shifting circuits that have different signal transition rates for positive and negative transitions and that also use two complementary signals that are carried on respective signal lines (conductive signal paths). The signal information is carried by a difference between two complementary signals, although the signal information can also be carried with reference to a reference voltage, such as ground. Each complementary signal can be driven using a similar configuration of a pull-up/down circuit and a drive circuit. Accordingly, embodiments of the present disclosure are directed toward monitoring a selected one of the two complementary signals for a positive transition and the other one of the two complementary signals for a negative transition. The monitored signal is then used to control the output of the level-shifted signal. In this manner, the output of the level-shifted signal can be provided with a similar delay regardless of the transition type (positive or negative).

Consistent with embodiments discussed herein, various aspects of the present disclosure are directed towards apparatus useful for processing communications between different signaling voltage levels. Such apparatus create true and complement signals from at least one input signal. The true and complement signals are each subject to different timing delays for respective signal transitions. Further, the true and complement signals are level shifted to a new signaling voltage level. The level shifting is accomplished by logic circuitry and signal control circuitry included in the apparatus. The logic control circuitry determines, relative to a particular signal state, which of the true and complement signals is subject to a smaller timing delay, and, in response to the determination, generates a selection signal that identifies the determined one of the true and complement signals. In response to the selection signal, the signal control circuitry provides the identified one of the true and complement signals as an output signal. In certain more specific embodiments, the signal control includes multiplexer. Additionally, various embodiments of the logic circuitry include a set reset (SR) latch. In embodiments where the logic circuitry includes a set reset (SR) latch, the logic circuitry can also include binary logic gates that controls the SR latch in response to changes in the true and complement signals. Further, in certain embodiments, each of the true and complement signals exhibits a positive to negative transition that has a smaller timing delay than a corresponding and respective negative to positive transition.

Various aspects of the present disclosure are also directed towards apparatus useful for creating an output signal that is level shifted to an output voltage signaling range in response to an input signal line carrying signals in an input voltage signaling range. A first drive circuit is provided to drive a first signal line low in response to a first signal level of the input signal, and additionally to release the first signal line in response to a second, different signal level of the input signal. Further, a second drive circuit drives a second signal line low in response to the second signal level of the input signal, and also releases the second signal line in response to the first signal level of the input signal. A pull-up/down circuit pulls up each of the signal lines to a signal level in the output voltage signaling range. In pulling up the signal lines, each line transitions from low to the signal level in the output voltage signaling range at a first rate that is slower than a second rate, and each signal line transitions from the signal level in the output voltage signaling range to low. In response to the faster of the transitions of the first and second signal lines, an output circuit generates the output signal. The faster transition of the lines is determined based upon a present or current state of the output signal (e.g., whether the output signal is presently or currently a "1" or a "0"). Determining the faster of the two transition lines allows for minimization of any possible delay that would occur in level shifting. For instance, the driving of signals from low-to-high may be slower than the shift from high-to-low. Aspects of the drive circuits therefore can also release the signals in order to provide a faster rate of shift. Accordingly, the inversion of the input signals to the signals lines and the driving or releasing of signals on each line allow for the faster of the transitions to be selected.

In certain embodiments, the output circuit produces both true and complement version of the output signal. Further, in other embodiments of apparatus of the present disclosure, the output circuit includes a set reset (SR) latch. In instances where the output circuit includes a set reset (SR) latch, the output circuit can also include a multiplexer that directs either of the first and second signal lines to the output. The output of the SR latch will control the multiplexer to select between the first and second signal lines based upon which of the first and second signal lines currently has the faster of the transitions.

The first drive circuit, in certain embodiments, includes a metal-oxide-semiconductor (MOS) transistor having a gate driven by the input signal, and a source connected to ground in the input voltage signaling range. Additionally, various embodiments of the second drive circuit include a MOS transistor having a gate driven by the input signal and a source connected to ground in the input voltage signaling range.

Further, the pull-up/down circuit, consistent with various aspects of the present disclosure, includes, in certain specific embodiments, a MOS transistor having a drain connected to a power supply voltage of the output voltage signaling range. The MOS transistor allows the first and second drive circuits to override the pull up to the power supply voltage. Additionally, certain embodiments of the pull-up/down circuit include a latch that can be overridden by the first and second drive circuits.

Aspects of the present disclosure are directed toward inverting a true signal, of true and complement signals available from a level shifter, and comparing inverted true signal with the complement signal. Alternatively, the complement signal can be inverted and compared with the true signal. In either instance, the two signals remain in phase with the other, and based on the level shifting of each of the signals, one such signal will have a faster falling edge and the other having a faster rising edge. In order to take advantage of the faster rising edge, a circuit is designed that selectively directs the signal having the fast edge to an output circuit. Because the next edge of the signals will be the opposite (e.g., the opposite signal will have the faster rising edge), after both signals have transitioned switching, the fastest edge in the opposite direction can be selected, and the propagation delay seen at the output can be minimized. Further, the difference in low to high and high to low propagation delay can also be minimized. Such functionality can be accomplished, for example using a multiplexer controlled by an RS latch. In this manner, NAND of the two signals (inverted true with complement) is used to set the latch, and the NOR of the two signals is used to reset the latch such that the correct signal is selected by the multiplexer can be used to create this functionality as in circuit.

Various embodiments are discussed herein with respect to a pull-up circuit and a drive circuit that drives a signal line low (e.g., to ground or to a low signal voltage level); however unless otherwise stated, such embodiments can also use a pull-down circuit with a drive circuit that drives signal line high (e.g., to a supply voltage/VDD or to a high signal voltage level). Accordingly, such pull-up/down circuits can pull the signal level on a signal line to an original voltage (a high voltage for a pull up and low voltage for pull down). The drive circuit can drive the signal line in the opposite voltage direction (high-to-low or low-to-high) and also release the signal line and thereby allow the pull-up/down to return the signal line to the original signal voltage level.

FIG. 1 shows a block diagram of an example apparatus useful for creating a level-shifted output voltage signaling range, consistent with various aspects of the present disclosure. FIG. 1 shows an input signal line 100 carrying signals in an input voltage signaling range. Pull-up/down circuit 130 sets the voltage level on a first signal line 120 to an original level that can be either high (pull-up) or low (pull-down). The input signal is provided to a first drive circuit/module 105, and an inverted input signal 110 is provided to a second drive circuit/module 115. In response to a first signal level of the input signal 100, the first drive circuit 105 drives a first signal line 120 to a second signal level. This second signal level is the opposite of the original signal level and can be either low/ground (when used with a pull-up circuit) or high/VDD (when used with a pull-down circuit). Further, in response to a second (different) signal level of the input signal 100, the first drive circuit 105 releases the first signal line 120 and allows the pull-up/down circuit 130 to return the signal line to the original signal level.

In response to the second signal level of the (inverted) input signal 110, the second drive circuit 115 drives a second signal line 125 to the opposite of the original signal level. Additionally, in response to the first signal level of the (inverted) input signal 110, the second drive circuit 115 will release the second signal line 125.

Due to the different drive mechanisms for the transitions to and from the original signal level, the transitions can have significantly different slew rates. For instance, the pull-up/down circuit 130 is overridden by the drive circuit 105 or 115. The stronger the pull-up/down circuit is (e.g., the power or current limitations), the stronger the drive circuit 105 or 115 needs to be and the more current and power that is used. Accordingly, it can be desirable to keep the drive strength of the pull-up/down circuit at a relatively low level. This can lead to a transition toward the original signal level that is slower than a transition provided by drive circuits 105 and 115, which is (away) from the original signal level (and to another signal level).

With reference to a pull-up configuration, the first signal line 120 and the second signal line 125 are pulled up to the original signal level, which can be in the output voltage signaling range, by a pull-up/down circuit 130. The pull-up/down circuit 130 will cause the first signal line 120 and the second signal line 125 to transition to the original signal level at a first rate that is slower than a second rate at which the first signal line 120 and the second signal line 125 transition from the original signal level (and to the opposite signal level in output voltage signaling range).

Additionally, an output circuit 135 generates an output signal 140 in response to the signal line (120 or 125) with the faster transition, which corresponds to the signal line in which the respective drive circuit (105 or 115) is actively driving. The output circuit 135 can therefore determine the faster transition of the first signal line 120 and the second signal line 125 based on a present or current state of the output signal 140. For instance, if the current state is high, then the next transition will be to a low value and the signal line with the faster transition time for such a high to low state change can be selected. If, however, the current state is low, then the next transition will be to a high value and the signal line with the faster transition time for such a low to high state change can be selected.

Figure 2:
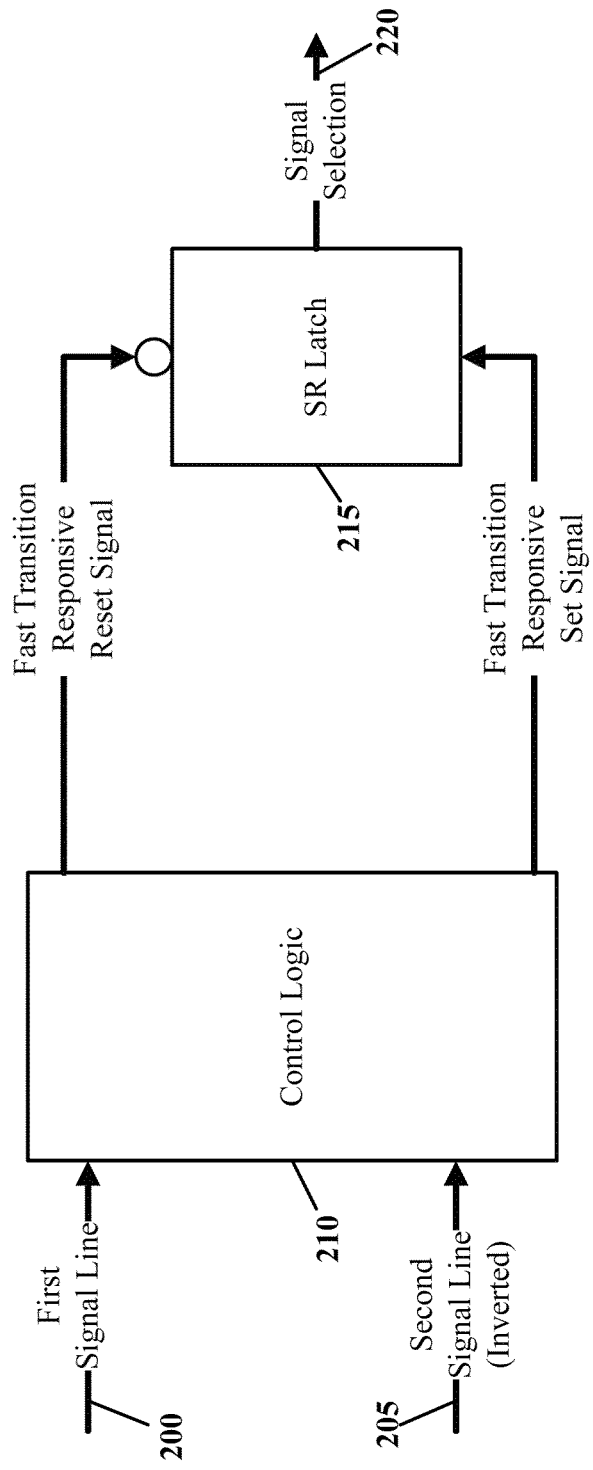
FIG. 2 shows a block diagram of a control logic for example output circuit, consistent with various aspects of the present disclosure.

FIG. 2 shows a block diagram of a control logic for example output circuit, consistent with various aspects of the present disclosure. FIG. 2 shows a first signal line 200 carrying an input signal, and a second signal line 205 carrying an inverted input signal. As described above, each of these signals may have different signal transition rates depending upon whether the signal transition is negative or positive (e.g., a transition from high to low may have a faster transition rate than that of a transition from low to high or vice versa). The signals are therefore inverted such that one of the two signals (either inverted or not inverted) will carry a signal having a faster transition. These signals are passed to a control logic circuit/module 210. The output circuit of FIG. 2 selectively determines which of the signals carried either on the first signal line 200 or the second signal line 205 has the faster level-shifted transition. The control logic circuit 210 can then generate a reset signal when one of the two signal lines 200, 205 has the faster transition and a set signal when the other of the two signal lines 200, 205 has the faster transition. The set and/or reset signals are passed to an SR latch 215. In response to this selection the SR latch 215 generates signal selection signal 220. Signal selection signal 220 can be used to control an output circuit that is configured and arranged to provide the faster of the signal lines as an output. For instance, a multiplexer can be controlled by the signal selection signal 220.

Figure 3:
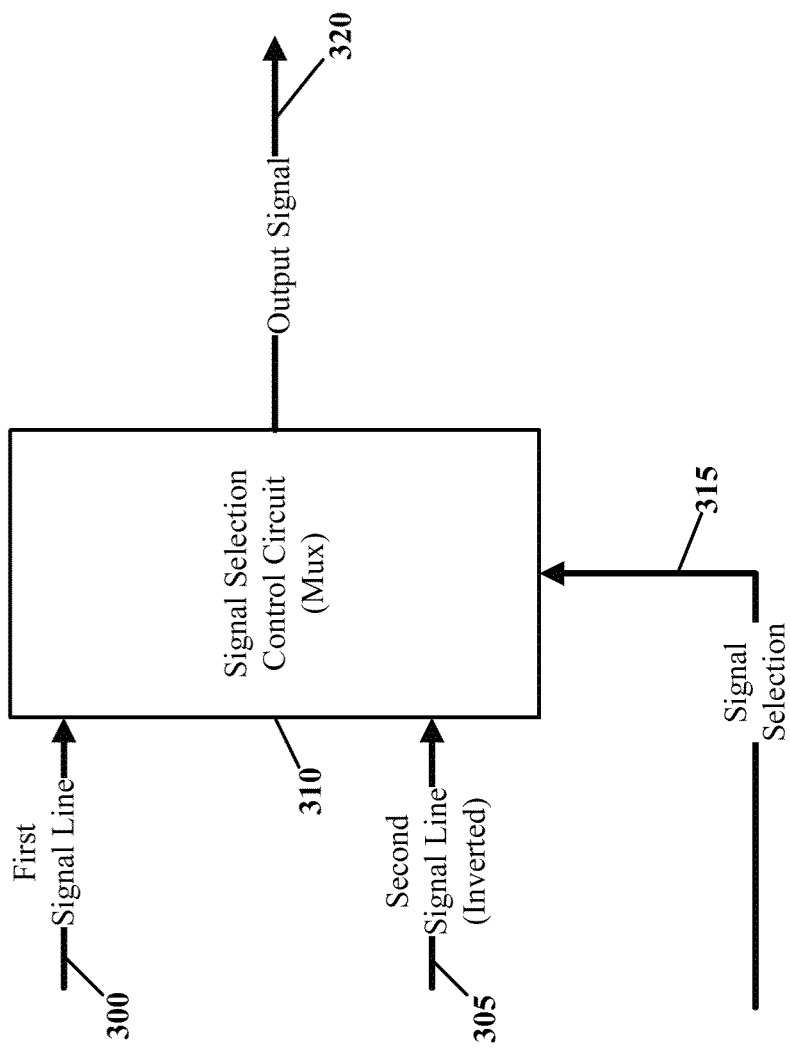
FIG. 3 shows a block diagram of a selection circuit for an example output circuit, consistent with various aspects of the present disclosure.

FIG. 3 shows a block diagram of a selection circuit for an example output circuit, consistent with various aspects of the present disclosure. As shown in FIG. 3, a signal and an inverted signal are carried, respectively, on a first signal line 300 and a second signal line 305. The signal and the inverted signal are passed to a signal selection control circuit/module (e.g., including a multiplexer) 310 along with a signal selection signal 315. The signal selection signal 315 informs the signal selection control circuit 310 of which of the two signals (inverted or not inverted) carried on the first signal line 300 and the second signal line 305 have a faster transition. The faster of the two signals is provided as an output signal 320.

Figure 4:
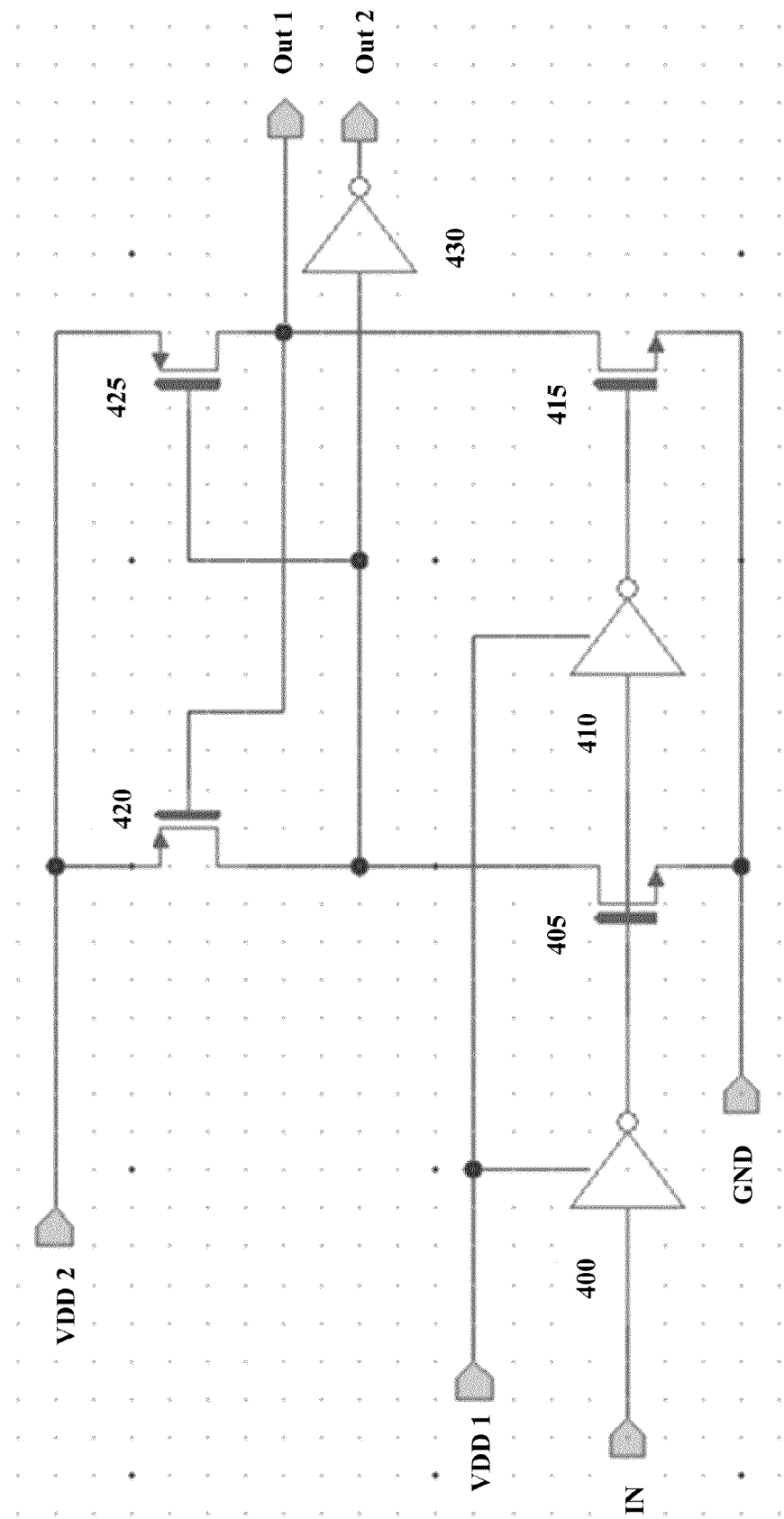
FIG. 4 shows a circuit level diagram of example drive circuitry and a pull-up circuit with a common ground, consistent with various aspects of the present disclosure.

FIG. 4 shows a circuit level diagram of example drive circuitry and a pull-up circuit with a common ground, consistent with various aspects of the present disclosure. The circuit level diagram shown in FIG. 4 has a common ground between both the input and output of the level-shifting circuit and has different amplitudes for the input and output. An input signal is passed to a first inverter 400. The first inverter 400 drives an NMOS transistor 405, via its gate, and acts as a buffer to a second inverter 410. This second inverter 410 drives the gate of another NMOS transistor 415. The drains of the NMOS transistors 405/415 operate in the voltage domain from $V_{DD2}$ to ground, whereas the drains of the NMOS transistor 405/415 are operable within the voltage domain of $V_{DD1}$ to ground. The circuit is also provided with PMOS transistors 420/425 that are also powered by $V_{DD2}$, and thus operate in the voltage domain of $V_{DD2}$ to ground. The gate of the PMOS transistor 420 is connected to the drain of PMOS transistor 425. The PMOS transistors 420/425 are sized smaller than the NMOS transistors 405/415. This allows for more easily driving of signals from high to low.

For example, when the input signal makes a high to low transition, the output of the first inverter 400 is low to high, which turns the NMOS transistor 405 on. The NMOS transistor 405 is turned on and the output is low, the PMOS transistor 420 will not be switched off until the low signal on the gate of the PMOS transistor 425 is turned on. In such an occurrence, the weak drive of the PMOS transistor 425 pulls-up the capacitance on the drain of the NMOS transistor 415 and the gate of PMOS transistor 420. In instances where the input signal has a low to high transition, the first inverter 400 switches its output to low and the NMOS transistor 405 will turn off. In response to the low output, the second inverter 410 switches its output high, and turns on the NMOS transistor 415. The drain of the NMOS transistor 415 will fall, and pull down the gate of the PMOS transistor 420, which causes the PMOS transistor 420 to turn on, and pull up the capacitance on the drain of the NMOS transistor 405 and the capacitance on the gate of PMOS transistor 425, and additionally pulls up the signal on the first output node (Out 1). The output signal is passed through a third inverted 430, and inverter. Therefore, the signal at the second output node (Out 2) will not be inverted with respect to the signal at the first output node (Out 1).

These two outputs can then be provided to control logic and signal selection circuits, as in FIGS. 2 and 3, to provide an output of the level shifter with a consistent (low) delay between input and output signaling transitions.

Figure 5:
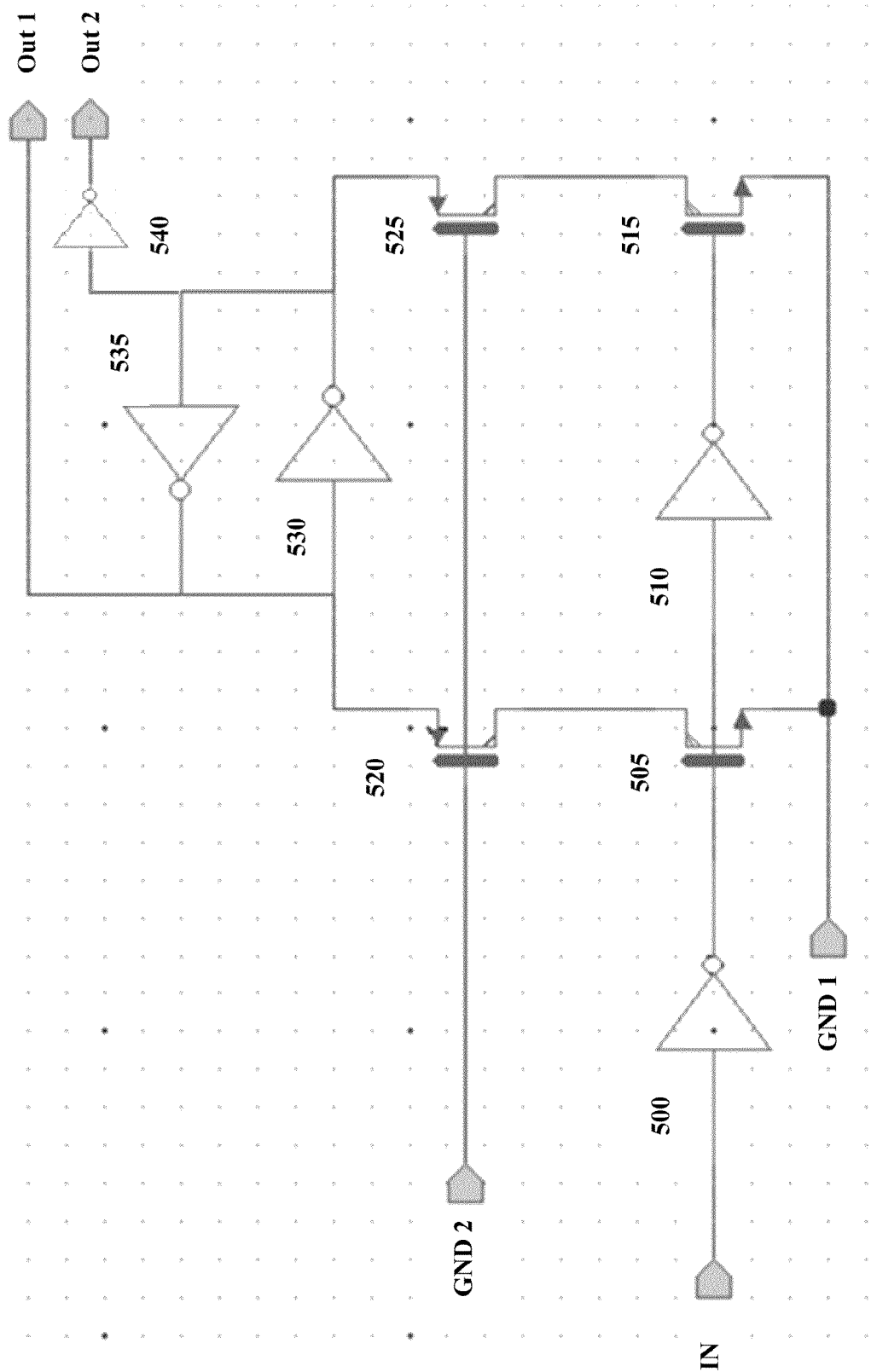
FIG. 5 shows a circuit level diagram of example drive circuitry and a pull-up circuit with different grounds, consistent with various aspects of the present disclosure.

FIG. 5 shows a circuit level diagram of example drive circuitry and a pull-up circuit with different grounds, consistent with various aspects of the present disclosure. In FIG. 5, rather than using a common ground and different amplitude supplies, the circuitry displayed therein uses two different grounds, which allows for a ground offset. In this manner, an input signal is provided to a first inverter 500. The first inverter 500 provides a buffer to driver a second inverter 510, and also drives the gate of NMOS transistor 505. Two PMOS transistors 520/525 are used as cascade devices and referenced to a second ground (GND 2). This connection prevents excessive voltage swings on the inputs and outputs of the second inverter 510 and a third inverter 530. The second and third inverters 510/530 form a latch, the combination of which provides a pull-up. In order for the circuit to drive to a low, NMOS transistors 505/515 must overcome this pull-up to drive to a low.

For instance, when the input signal (IN) transitions from high to low, the output of the first inverter 500 transitions from low to high and this results in the NMOS transistor 505 turning on. The output of the second inverter 510 transitions from high to low and drives the gate of the NMOS transistor 515. This switches the NMOS transistor 515 off when the input signal (IN) is low. When the NMOS transistor 505 turns on, it pulls down against the drain of the PMOS cascade transistor 520, and in turn pulls down the source of the MPOS transistor 520. This action is initially resisted by the series combination of the PMOS transistor 520 and output of the fourth inverter 535. However, the NMOS transistor 505 is strong enough to pull the source of PMOS cascade transistor 520 down to a threshold above the level of the second ground (GND 2). The combination of the third inverter 530 and a fourth inverter 535, making up an inverter latch, interprets this as a low. Accordingly, the output of the third inverter 530 pulls up on the source of PMOS cascade transistor 525 which turns on when the source thereof reaches a threshold above the second ground (GND 2), and allows the output of the third inverter 530 to charge the drain of the NMOS transistor 515. In response to the drain of the drain of the NMOS transistor 515 charging past a state above the second ground (GND 2), the fourth inverter 535 turns off its pull-up.

In the occurrences of the input signal transition from low to high, the first inverter 500 switches its output low and the NMOS transistors 505 turns off. In response thereto, the second inverter 510 switches its output high, and turns the NMOS transistor 515 on. The NMOS transistor 515 pulls down against the drain on the PMOS cascade transistor 525, which in turn pulls down the source of the PMOS cascade transistor 525. This is initially resisted by the series combination of the PMOS cascade transistor 525 and the output of the third inverter 530; however, the strength of the NMOS transistor 515 pulls the source of PMOS cascade transistor 520 to a threshold above the second ground (GND 2). In response thereto, the inverter latch, the combination of the third inverter 530 and the fourth inverter 535, sees a low, and the output of the fourth inverter 535 pulls up on the source of the PMOS cascade transistor 520. The PMOS cascade transistor 520 turns on when the source reaches a threshold above the second ground (GND 2). This allows the output of the fourth inverter 535 to charge the drain on the NMOS transistor 505. In response to the drain on the NMOS transistor 505 charged to a state above the second ground (GND 2), the third inverter 530 will switch and turn off its pull-up. In this manner, the high to low transistor is fast. The circuit includes two output signals at Out 1 and Out 2. The second output signal will be inverted by a fifth inverter 540. Therefore, the output signals from the circuit will be inverted such that one of the signals will always be transitioning from high to low. The faster of the two signals is selected by output circuitry (as discussed herein), thereby insuring that the level shifted signal has a consistent (low) delay.

Other embodiments of the present disclosure are not necessarily limited to the specific circuits and devices depicted in the figures. For instance, the circuits are not necessarily limited to NMOS and PMOS transistors.

Figure 6:
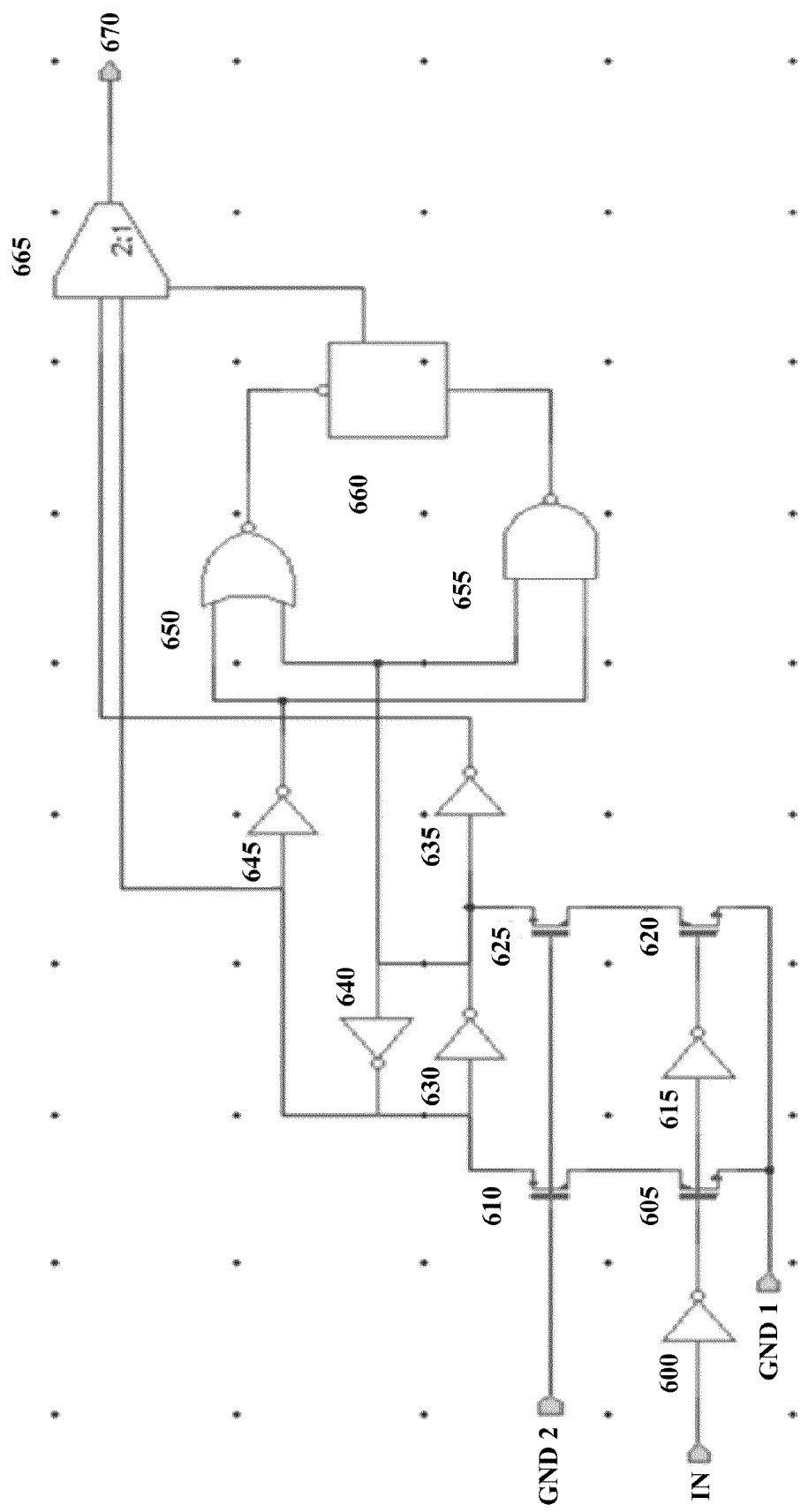
FIG. 6 shows a circuit level diagram of an example apparatus useful for creating a level shifted output voltage signaling range, consistent with various aspects of the present disclosure.

FIG. 6 shows a circuit level diagram of an example apparatus useful for creating a level shifted output voltage signaling range, consistent with various aspects of the present disclosure. Input signals are shifted by a level shifter including a set of inverters 600/615/630/640 and transistors 605/610/620/625. A more detailed description of the function of a similar level shifter circuit can be obtained with reference to the above described FIG. 5. The "true" output of level shifter is inverted by an inverter 645, and the "complement" output is inverted by an inverter 635.

The circuits of FIG. 6 are designed to be responsive to a different signal depending upon the current signal state and/or the signal transition type (negative or positive transition). For instance, in response to both the true and complement signals being high, an AND gate 655 sets an RS latch 660. A NOR gate 650 resets the latch 660 when both the inverted true and complement signals are low. A multiplexer 665 selects between the true and the inverted complement signals such that the faster output transition appears at the output 670 of the circuit. Accordingly, the faster edge is selectively utilized by switching between two signals that are in phase but have different edge propagation delays. The circuit configuration shown in FIG. 6 is not limiting. For instance, the level shifter circuitry noted, and with reference to FIG. 5, can be replaced with level-shifting circuitry similar to the circuitry described with reference to FIG. 4.

The circuits depicted in FIGS. 4-6 use a pull-up circuit(s) as part of the level-shifting to the voltage range of the output circuit. In other embodiments of the present disclosure a pull-down circuit(s) can be used. The corresponding drive circuit could then be configured (e.g., using a different type of MOS transistor) to drive the signal line to a high voltage level and to release the signal line to allow the pull-down circuit to bring the signal line to a low voltage level. The control logic could also be modified to identify or select to the signal having a negative-to-positive transition as the faster transition.

Various modules may be implemented to carry out one or more of the operations and activities described herein and/or shown in the figures. In these contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the Figures. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the present invention without strictly following the exemplary embodiments and applications illustrated and described herein. For example, the particular circuit components can be modified to include reasonable variations providing similar functions. In addition, embodiments of U.S. provisional application No. 61/692,377, filed on Aug. 23, 2012 to Anderson, Alma, can be used alone or in combination with the embodiments discussed herein, this provisional application is fully incorporated herein by reference. Such modifications do not depart from the true spirit and scope of the present invention, including that set forth in the following claims.

The invention claimed is:

1. An apparatus useful for processing communications between different signaling voltage levels by creating true and complement signals from at least one input signal, whereby the true and complement signals are each subject to different timing delays for respective signal transitions, the true and complement signals being level shifted to a new signaling voltage level and one of the true and complement signals being inverted relative to the input signal, the apparatus comprising:
   logic circuitry configured and arranged to
      determine, relative to a particular signal state and using binary logic gates that each receive the true and complement signals as inputs, which of the true and complement signals is subject to a smaller timing delay, and
      to generate, in response to the determination, a selection signal that identifies the one of the true and complement signals determined as being subject to the smaller timing delay; and
   signal selection control circuitry configured and arranged to provide, in response to the selection signal, the one of the true and complement signals determined as being subject to the smaller timing delay as an output signal.

2. The apparatus of claim 1, wherein the logic circuitry includes a set reset (SR) latch and a control logic circuit configured and arranged with the SR latch to
   provide a set signal to a set input of the SR latch in response to a first one of the true and complement signals being subject to a smaller timing delay, and
   provide a reset signal to a reset input of the SR latch in response to a second one of the true and complement signals being subject to a smaller timing delay.

3. The apparatus of claim 2 wherein the binary logic gates include a NAND gate and a NOR gate that are each are configured and arranged to control the SR latch in response to changes in both the true and complement signals.

4. The apparatus of claim 1, wherein each of the true and complement signals exhibits a positive to negative transition that has a smaller timing delay than a corresponding and respective negative to positive transition.

5. The apparatus of claim 1, wherein each of the true and complement signals exhibits a negative to positive transition that has a smaller timing delay than a corresponding and respective positive to negative transition.

6. The apparatus of claim 1, wherein the logic circuitry includes a set reset (SR) latch that is configured and arranged to be set in response to both the complement signal and inverted true signal being high and to be reset in response to both the complement signal and the inverted true signal and being low.

7. The apparatus of claim 1, further including level-shifting circuitry that is configured and arranged to receive the true and complement signals from at least one input signal that are each referenced to a first ground and to produce the identified one of the true and complement signals as the output signal that is referenced to a second, different ground.

8. The apparatus of claim 1, further including drive circuitry that is configured and arranged to drive signal lines corresponding to the true and complement signals using metal-oxide-semiconductor (MOS) transistors.

9. The apparatus of claim 1, further including drive circuitry that is configured and arranged to pull-up signal lines corresponding to the true and complement signals using metal-oxide-semiconductor (MOS) transistors.

10. An apparatus useful for creating an output signal that is level shifted to an output voltage signaling range in response to an input signal line carrying signals in an input voltage signaling range, the apparatus comprising:
   a first drive circuit configured and arranged to
      drive a first signal line in response to a first signal level of an input signal carried on the input signal line; and
      release the first signal line in response to a second, different signal level of the input signal;
   a second drive circuit configured and arranged to
      drive a second signal line in response to the second signal level of the input signal; and
      release the second signal line in response to the first signal level of the input signal;
   a pull-up/down circuit configured and arranged to pull each of the first and second signal lines to a signal level in the output voltage signaling range, whereby the first and second signal lines each transition to the signal level in the output voltage signaling range at a first rate that is slower than a second rate at which the first and second signal lines each transition in response to being driven by the first and second drive circuits, respectively;
   an output circuit configured and arranged to generate the output signal in response to determining, based upon a present state of the output signal and using binary logic gates that each use both the true and complement signals as inputs, which of the first and second signal lines has a faster transition, wherein the output circuit produces both true and complement versions of the output signal, one of the true and complement versions being inverted relative to the input signal; and
   signal selection control circuitry configured and arranged to provide, as an output, one of the true and complement versions of the output signal that is subject to a smaller timing delay relative to the other one of the true and complement versions of the output signal.

11. The apparatus of claim 10, wherein the pull-up/down circuit is a pull-up circuit that pulls the signal lines to a high level and wherein the true and complement signals that is subject to the faster rate corresponds to which of the true and complement versions has a high-to-low transition.

12. The apparatus of claim 10, wherein the pull-up/down circuit is a pull-down circuit that pulls the signal lines to a low level and wherein the true and complement signals that is subject to the faster rate corresponds to which of the true and complement versions has a low-to-high transition.

13. The apparatus of claim 10, wherein the output circuit further includes a multiplexer configured and arranged to provide either of the first and second signal lines to the output and includes an SR latch with an output that is configured and arranged to control which of the first and second signal lines is provided by the multiplexer in response to detecting which of the first and second signal lines currently has the faster of the transitions.

14. The apparatus of claim 10, wherein the first drive circuit includes a metal-oxide-semiconductor (MOS) transistor having a gate driven by the input signal and a source connected to ground in the input voltage signaling range.

15. The apparatus of claim 10, wherein the second drive circuit includes a metal-oxide-semiconductor (MOS) transistor having a gate driven by the input signal and a source connected to ground in the input voltage signaling range.

16. The apparatus of claim 10, wherein the pull-up/down circuit includes a metal-oxide-semiconductor (MOS) transistor having a drain connected to a power supply voltage of the output voltage signaling range and wherein the MOS transistor is configured and arranged to allow the first and second drive circuits to override the pull up to the power supply voltage.

17. The apparatus of claim 10, wherein the pull-up/down circuit includes a latch that is configured and arranged to be overridden by the first and second drive circuits.

18. A method for processing communications between different signaling voltage levels by creating into true and complement signals from at least one input signal, whereby the true and complement signals are each subject to different timing delays for respective signal transitions, the true and complement signals being level shifted to a new signaling voltage level and one of the true and complement signals being inverted relative to the input signal, the method comprising:
   determining, relative to a particular signal state and using binary logic gates that each use both the true and complement signals as inputs, which of the true and complement signals is subject to a smaller timing delay;
   generating, in response to the determination, a selection signal that identifies the one of the true and complement signals determined as being subject to the smaller timing delay; and
   providing, in response to the selection signal, the identified one of the true and complement signals determined as being subject to the smaller timing delay as an output signal.

19. The method of claim 18, wherein the step of providing uses signal control circuitry that includes a multiplexer.

20. The method of claim 19, wherein the step of determining uses logic circuitry that includes a set reset (SR) latch.

* * * * *